United States Patent
Kim et al.

(10) Patent No.: US 8,779,487 B2
(45) Date of Patent: Jul. 15, 2014

(54) SEMICONDUCTOR DEVICES INCLUDING STORAGE NODE LANDING PADS SEPARATED FROM BIT LINE CONTACT PLUGS

(75) Inventors: Yong-il Kim, Gyeonggi-do (KR); Makoto Yoshida, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 497 days.

(21) Appl. No.: 13/183,100

(22) Filed: Jul. 14, 2011

(65) Prior Publication Data

US 2011/0266602 A1   Nov. 3, 2011

Related U.S. Application Data

(63) Continuation of application No. 12/422,151, filed on Apr. 10, 2009, now Pat. No. 8,003,514.

(30) Foreign Application Priority Data

Apr. 11, 2008   (KR) .................. 10-2008-0033874

(51) Int. Cl.
   *H01L 27/108*   (2006.01)
(52) U.S. Cl.
   CPC .... *H01L 27/10855* (2013.01); *H01L 27/10888* (2013.01)
   USPC ............... 257/296; 257/288; 257/E27.084
(58) Field of Classification Search
   USPC .............................. 257/296, 288
   See application file for complete search history.

(56) References Cited

U.S. PATENT DOCUMENTS

| 5,688,713 | A | 11/1997 | Linliu et al. |
| 6,258,649 | B1 | 7/2001 | Nakamura et al. |
| 2001/0005624 | A1 | 6/2001 | Aoyagi et al. |
| 2001/0041404 | A1 | 11/2001 | Uchiyama |
| 2003/0038325 | A1* | 2/2003 | Sugawara et al. ............ 257/396 |
| 2005/0001253 | A1 | 1/2005 | Sugimura |

FOREIGN PATENT DOCUMENTS

| KR | 100155831 B1 | 7/1998 |
| KR | 1020060113264 A | 11/2006 |
| KR | 1020070112551 A | 11/2007 |

OTHER PUBLICATIONS

Korean Notice of Non-Final Rejection; corresponding application No. 10-2008-0033874; Jan. 14, 2014.

* cited by examiner

*Primary Examiner* — Angel Roman
(74) *Attorney, Agent, or Firm* — Myers Bigel Sibley & Sajovec, P.A.

(57) ABSTRACT

A Dynamic Random Access Memory (DRAM) device can include a semiconductor substrate that includes an active region including a source region therein. A gate line can cross the active region and a first contact plug can be on the active region adjacent to the gate line and can be connected to the source region. A conductive layer can be on the first contact plug to expose a portion of the first contact plug and a capacitor storage node electrode can be on the conductive layer.

18 Claims, 12 Drawing Sheets

SEMICONDUCTOR DEVICES INCLUDING STORAGE NODE LANDING PADS SEPARATED FROM BIT LINE CONTACT PLUGS

CROSS-REFERENCE TO RELATED PATENT APPLICATIONS

This Application is a Continuation of U.S. application Ser. No. 12/422,151, filed in the U.S.P.T.O. on Apr. 10, 2009 now U.S. Pat. No. 8,003,514, this application also claims the benefit of Korean Patent Application No. 10-2008-0033874, filed on Apr. 11, 2008, in the Korean Intellectual Property Office, all of the disclosures of which are incorporated herein in their entireties by reference.

FIELD OF THE INVENTION

The present invention relates to methods of fabricating a semiconductor device, and more particularly, to methods of fabricating a semiconductor device including contact plugs.

BACKGROUND OF THE INVENTION

In general, semiconductor devices can include wires for electrically connecting separate devices, such as transistors or capacitors, to each other. The wires can contact the separate devices via contact plugs that penetrate an interlayer dielectric layer.

SUMMARY OF THE INVENTION

In some embodiments according to the present invention, a Dynamic Random Access Memory (DRAM) device can include a semiconductor substrate that includes an active region including a source region therein. A gate line can cross the active region and a first contact plug can be on the active region adjacent to the gate line and can be connected to the source region. A conductive layer can be on the first contact plug to expose a portion of the first contact plug and a capacitor storage node electrode can be on the conductive layer.

DETAILED DESCRIPTION

Figure 1:
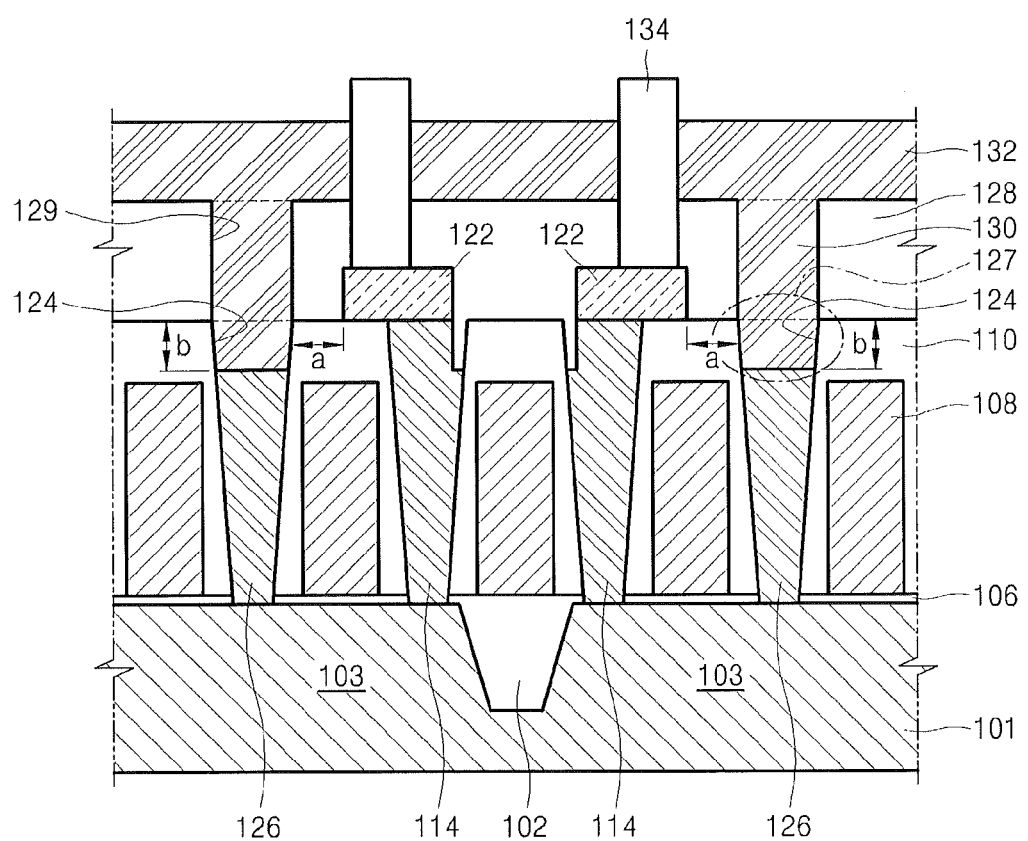
FIG. 1 is a schematic cross-sectional view of a semiconductor device in some embodiments according to the present invention.

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will be omitted.

It will be understood that when an element, such as a layer, is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly. Also, as used herein, "lateral" refers to a direction that is substantially orthogonal to a vertical direction.

In some embodiments according to the present invention, a large capacity dynamic random access memory (DRAM) is described as an example of the semiconductor device; however, embodiments according to the present invention are not limited thereto. Each of a plurality of memory cells in the DRAM device includes an access transistor and a capacitor. The access transistor includes a gate line and source/drain electrodes formed on a semiconductor substrate, and the capacitor includes a storage node (storage electrode), a dielectric layer, and a plate electrode. The source/drain electrodes are respectively connected to the storage node or bit lines via first and second contact plugs that penetrate an interlayer dielectric layer on the semiconductor substrate.

In some embodiments according to the present invention, a landing pad is located on a first contact plug connected to a storage node in order to increase a contact area between the first contact plug and a storage node contact plug. However, as appreciated by the present inventors, as the semiconductor device becomes more highly integrated, a distance between the first contact plug connected to the storage node and a second contact plug connected to a bit line can decrease, and thus, electrical shorts may be generated between the landing pad, on the first contact plug connected to the storage node, and the second contact plug connected to the bit line. In some embodiments according to the present invention, the second contact plug connected to the bit line, on which a landing pad is not formed, is recessed to form a recessed contact plug, which may reduce the risk of electrical shorts therebetween.

In other words, in some embodiments according to the present invention, an upper surface of the second contact plug (connected to the bit line) is recessed below a lower surface of the landing pad connected to the storage node. The lower surface of the landing pad can face the upper surface of the second contact plug. Furthermore, an upper surface of the first contact plug (on which the lower surface of the landing pad is formed) is above the upper surface of the second contact plug, so that the upper surface of the second contact plug is recessed below both the lower surface of the landing pad and the upper surface of the first contact plug. Therefore, in some embodiments according to the present invention, a total distance between the first contact plug/landing pad and the second contact can be increased even as the spacing between devices is reduced. In some embodiments according to the present invention, the total distance includes a lateral and a vertical spacing. In other words, in some embodiments according to the present invention, the upper surface of the second contact can have increased spacing both the lateral and vertical directions.

In some embodiments according to the present invention, a contact plug is recessed to reduce electrical shorts between a landing pad that is formed on an immediately adjacent one of the contact plugs. In particular, a recessed contact plug can be formed simultaneously with the landing pad using the same process, and thus, electrical shorts between the landing pad and the contact plug can be reduced without performing an additional process for forming the recessed contact plug.

FIG. 1 is a schematic cross-sectional view of a semiconductor device in some embodiments according to the present invention. Referring to FIG. 1, the semiconductor device of the present embodiment includes a device isolation layer 102 and active regions 103 formed in a semiconductor substrate 101, for example, a silicon substrate. A gate insulating layer 106 and gate lines 108 (word lines) are formed on the active regions 103. Each of the gate lines 108 includes a gate electrode (not shown) formed on the gate insulating layer 106 and a capping layer (not shown) covering the gate electrode.

A first interlayer dielectric layer 110 for insulating the gate lines 108 from each other is formed on the entire surface of the semiconductor substrate 101, on which the gate lines 108 are formed. First contact plugs 114 and recessed contact plugs 126 that contact the active region 103 between the gate lines 108 by penetrating the first interlayer dielectric layer 110 are formed. Each of the recessed contact plugs 126 has a recessed portion 124, wherein the recessed contact plugs 126 are disposed lower than an upper surface of the first interlayer dielectric layer 110. The first contact plugs 114 are contact plugs that are electrically connected to storage node contact plugs. The recessed contact plugs 126 are contact plugs that are electrically connected to bit line contact plugs.

Landing pads 122 are formed as islands on the first contact plugs 114 and the first interlayer dielectric layer 110 so as to overlap a part of the first contact plugs 114. The landing pads 122 are connected to respective storage node contact plugs 134. The landing pads 122 are formed to increase a contact area between the first contact plugs 114 and the storage node contact plugs 134. That is, the landing pads 122 are formed so as to increase the contact area between the first contact plugs 114 and the storage node contact plugs 134 when the first contact plugs 114 and the storage node contact plugs 134 deviate from each other vertically.

In particular, in some embodiments according to the present invention, a cross-sectional distance between the landing pads 122 and the recessed contact plugs 126 increases due to the recessed portions 124 as shown in reference numeral 127. The distance can include both a lateral spacing shown by "a" and a vertical spacing shown by "b" in FIG. 1. That is, if the plug 126 were not recessed, the distance between the landing pads 122 and the plug 126 is "a"; however, in some embodiments according to the present invention, the total distance between the landing pads 122 and the recessed contact plugs 126 includes "a"+"b" due to the recessed portions 124. Therefore, electrical shorts between the landing pads 122 and the recessed contact plugs 126 can be reduced despite when the semiconductor device is highly integrated.

A second interlayer dielectric layer 128 is formed on the entire surface of the semiconductor device, on which the first contact plugs 114 and the recessed contact plugs 126 are formed. Then, the second interlayer dielectric layer 128 is etched to form contact holes 129 exposing the upper surfaces of the recessed contact plugs 126. Accordingly, third contact plugs 130 that are connected to the recessed contact plugs 126 by penetrating the contact holes 129 are formed. The third contact plugs 130 are bit line contact plugs that are connected to a bit line 132.

Hereinafter, methods of fabricating the semiconductor device of FIG. 1 in some embodiments according to the invention will be described in detail. FIGS. 2 through 12 are schematic cross-sectional and plan views illustrating methods of fabricating a semiconductor device, in some embodiments according to the present invention. Here, the semiconductor device is a DRAM device, as an example. FIGS. 2 through 12 illustrate an exemplary method of fabricating the semiconductor device, and the present invention is not limited thereto.

Figure 2:
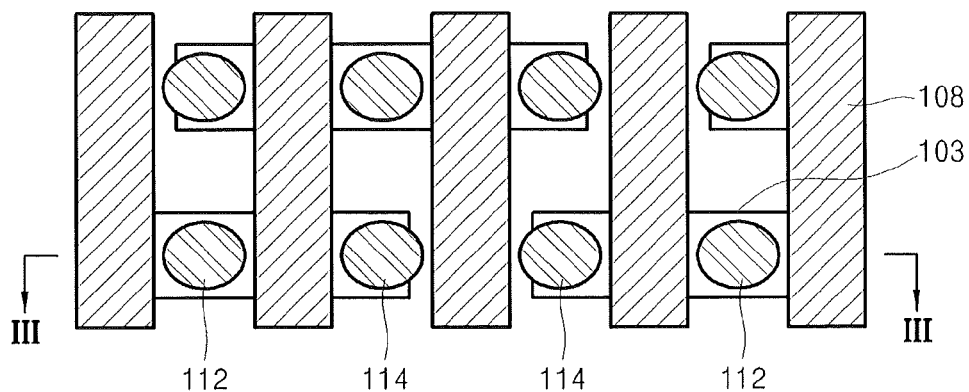
FIGS. 2 through 12 are schematic cross-sectional and plan views illustrating methods of fabricating a semiconductor device in some embodiments according to the present invention.
Figure 3:
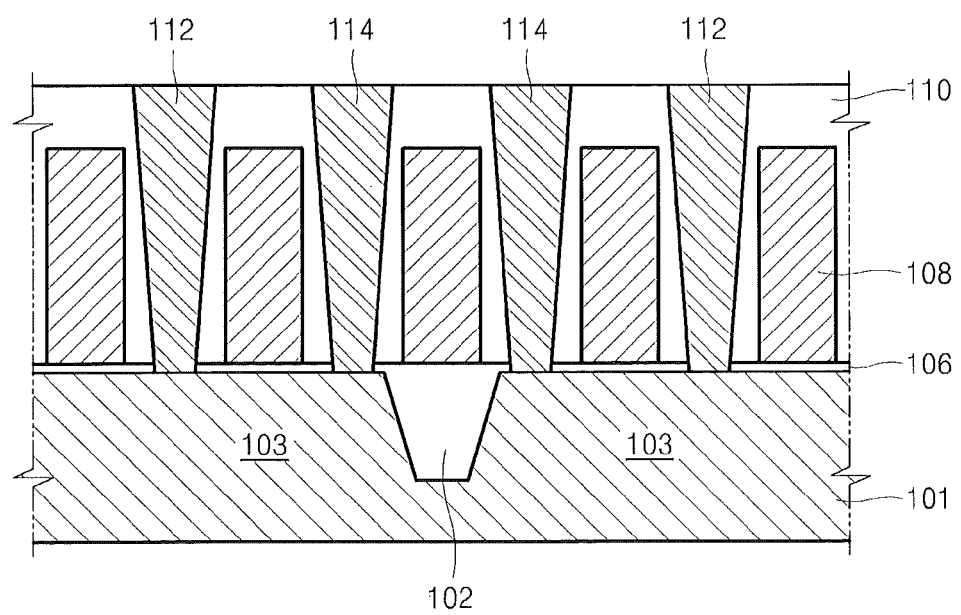

Referring to FIGS. 2 and 3, FIG. 2 is a plan view of the semiconductor device, and FIG. 3 is a cross-sectional view of the semiconductor device taken along a line III-III of FIG. 2. Referring to FIG. 3, device isolation layers 102 are formed in a semiconductor substrate 101, for example, a silicon substrate, to define a plurality of active regions 103. Referring to FIG. 2, the active regions 103 are formed on a plane, and the device isolation layers 102 are formed between the active regions 103. The device isolation layers 102 may be formed using a shallow trench isolation method.

A gate insulating layer 106 is formed on the active regions 103 of the semiconductor substrate 101. In addition, a plurality of gate lines 108 (word lines) are formed to cross the active regions 103 of the semiconductor substrate 101. Each of the gate lines 108 includes a gate electrode (not shown) formed on a gate insulating layer, and a capping layer (not shown) covering the gate electrode. The gate lines 108 may be formed by depositing a polysilicon layer pattern and a metal silicide layer pattern, and may include spacers on both sidewalls of the gate electrodes.

Referring to FIG. 3, a first interlayer dielectric layer 110 insulating the gate lines 108 is formed on the entire surface of the semiconductor substrate 101, on which the gate lines 108 are formed. The first interlayer dielectric layer 110 may include silicon oxide. In addition, first contact plugs 114 and second contact plugs 112, which are respectively connected to the active regions 103 between the gate lines 108 by penetrating the first interlayer dielectric layer 110, are formed. The first and second contact plugs 114 and 112 may be polysilicon layers doped with impurities. The first contact plugs 114 are electrically connected to storage node contact plugs subsequently. The second contact plugs 112 are electrically connected to bit lines contact plugs subsequently.

Figure 4:
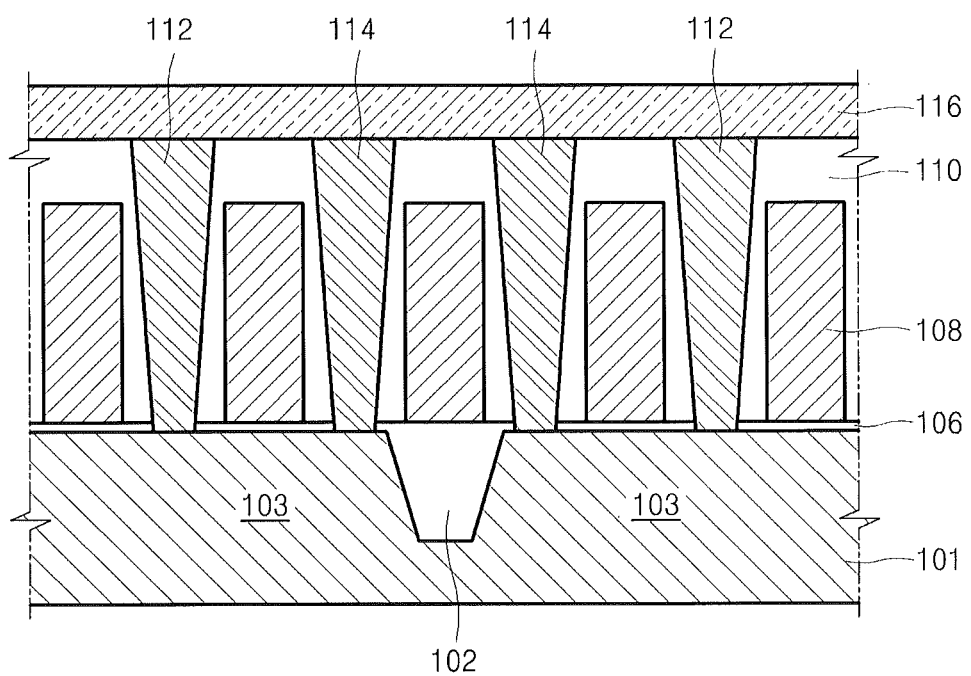
Figure 5:
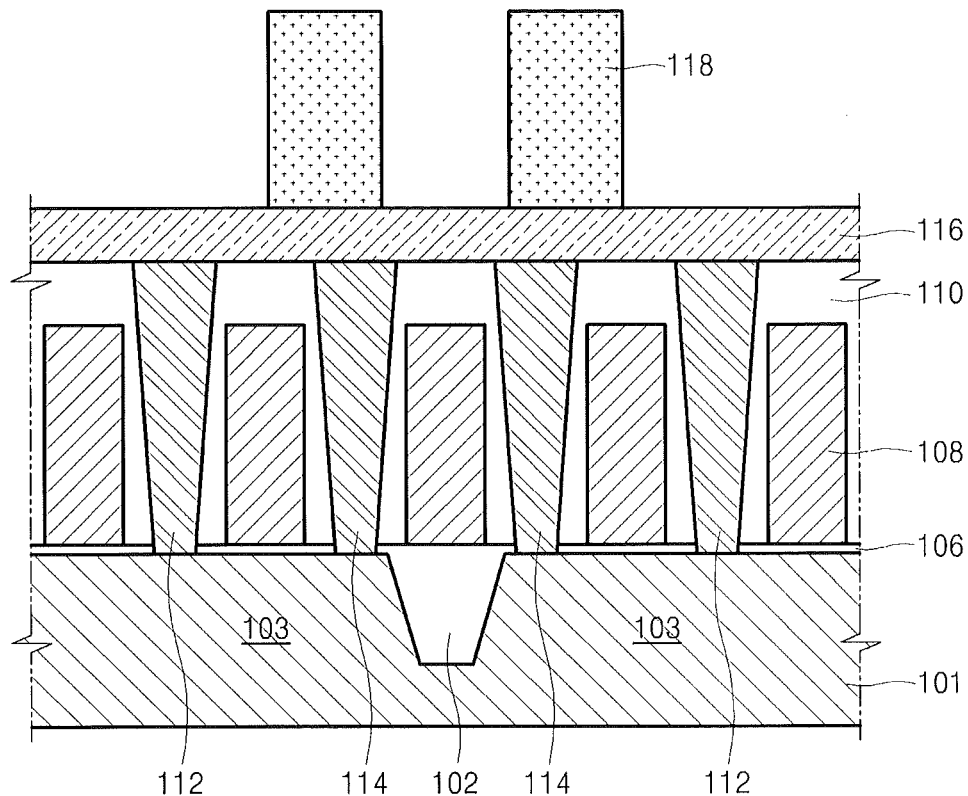

Referring to FIGS. 4 and 5, a conductive layer 116 for forming landing pads is formed on the first contact plugs 114, the second contact plugs, 112, and the first interlayer dielectric layer 110. The conductive layer 116 for the landing pads may comprise a polysilicon layer doped with impurities or a metal layer such as a tungsten layer. When the conductive layer 116 for the landing pads comprises a metal layer such as a tungsten layer, contact resistance between the conductive layer 116 and fourth contact plugs (134 of FIG. 12) may decrease, and the polysilicon layer forming the second contact plugs 112 can be subsequently etched. Referring to FIG. 5, a mask layer 118 for forming the landing pads is formed on the conductive layer 116. The mask layer 118 for forming the landing pads is formed to expose upper portions of the second contact plugs 112. The mask layer 118 for the landing pads may be formed using a photolithographic process.

Figure 6:
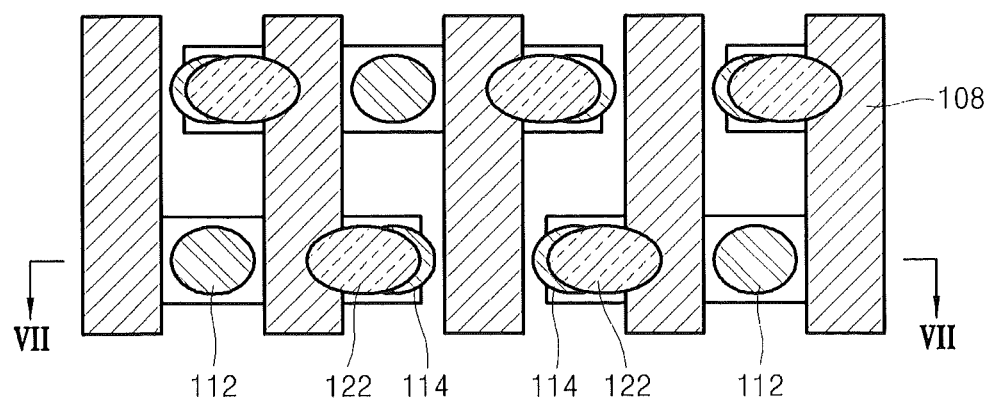
Figure 7:
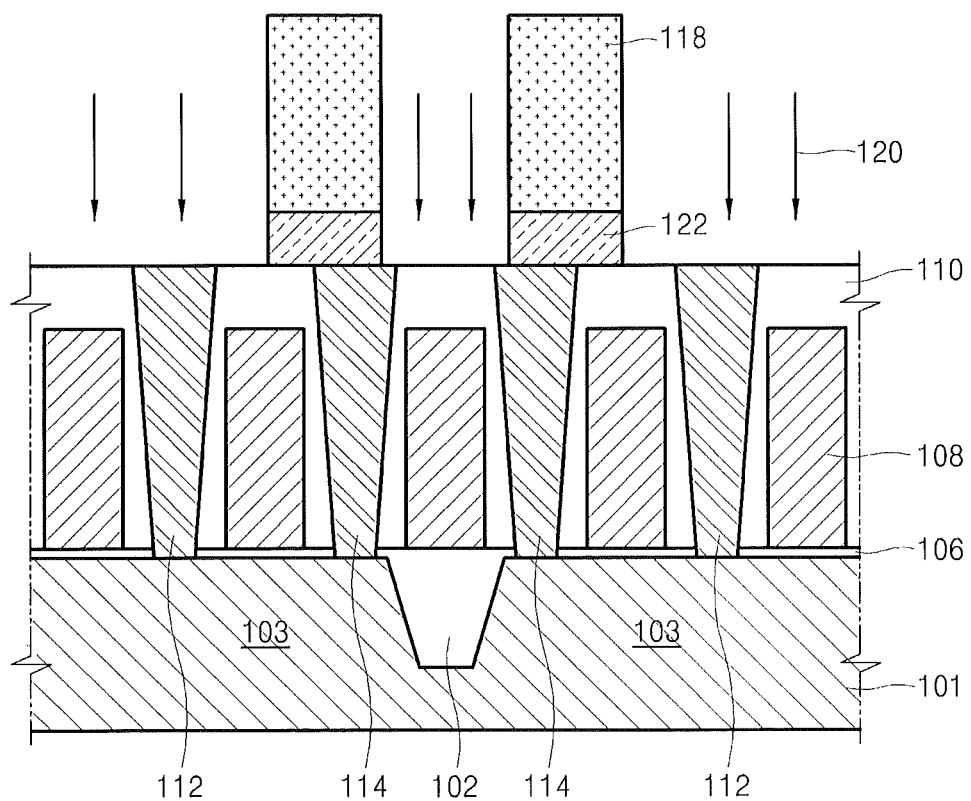

FIG. 6 is a plan view of the semiconductor device, and FIG. 7 is a cross-sectional view of the semiconductor device taken along a line VII-VII of FIG. 6. As denoted by reference numeral 120, the conductive layer 116 for forming the landing pads is etched using the mask layer 118 as an etching mask. The conductive layer 116 may be etched using a dry etching method. Then, landing pads 122 are formed as islands overlapping portions of the first contact plugs 114, and upper surfaces of the second contact plugs 112 are exposed.

Figure 8:
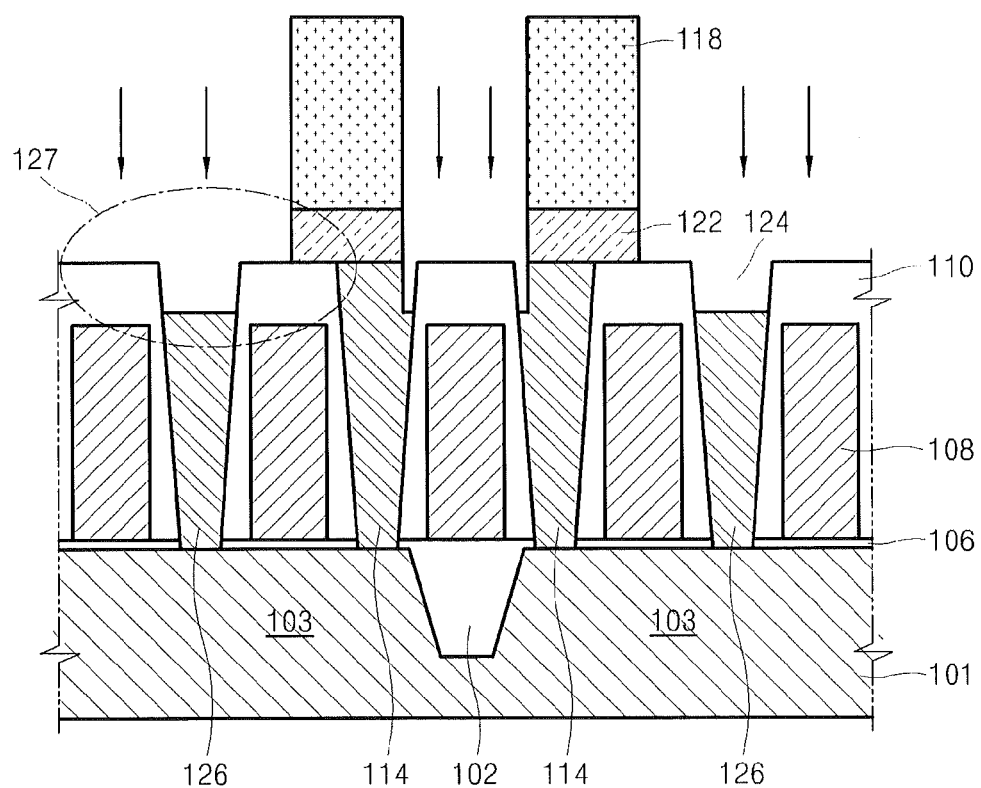

Referring to FIG. 8, the second contact plugs 112 are etched using the mask layer 118 as an etching mask to form the recessed contact plugs 126 having recessed portions 124 (also referred to herein as "recesses 124"), so that the upper surfaces of the recessed contact plugs 126 are located below the upper surface of the first interlayer dielectric layer 110. After forming the recessed contact plugs 126, the mask layer 118 for forming the landing pads 122 is removed.

In some embodiments according to the present invention, according to FIG. 5-8 for example, the conductive layer 116 and the underlying second contact plugs 112 are etched simultaneously to form the recessed contact plugs 126. Accordingly, the recessed contact plugs 126 can be formed without performing an additional fabrication step.

In particular, the total distance between the landing pads 122 and the recessed contact plugs 126 can be increased due to the recesses 124 above the upper surfaces of the recessed contact plugs 126 as denoted by the portion of FIG. 8 associated with reference numeral 127. Accordingly, electrical shorts between the landing pads 122 and the recessed contact plugs 126 can be reduced.

Figure 9:
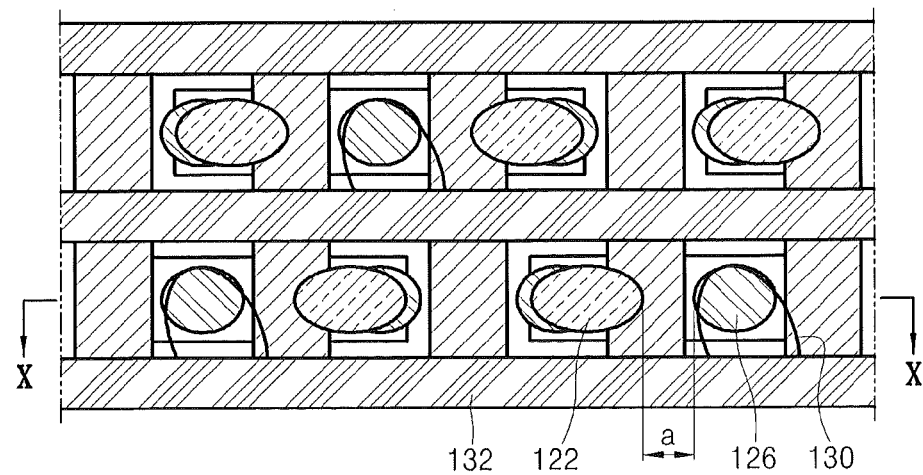
Figure 10:
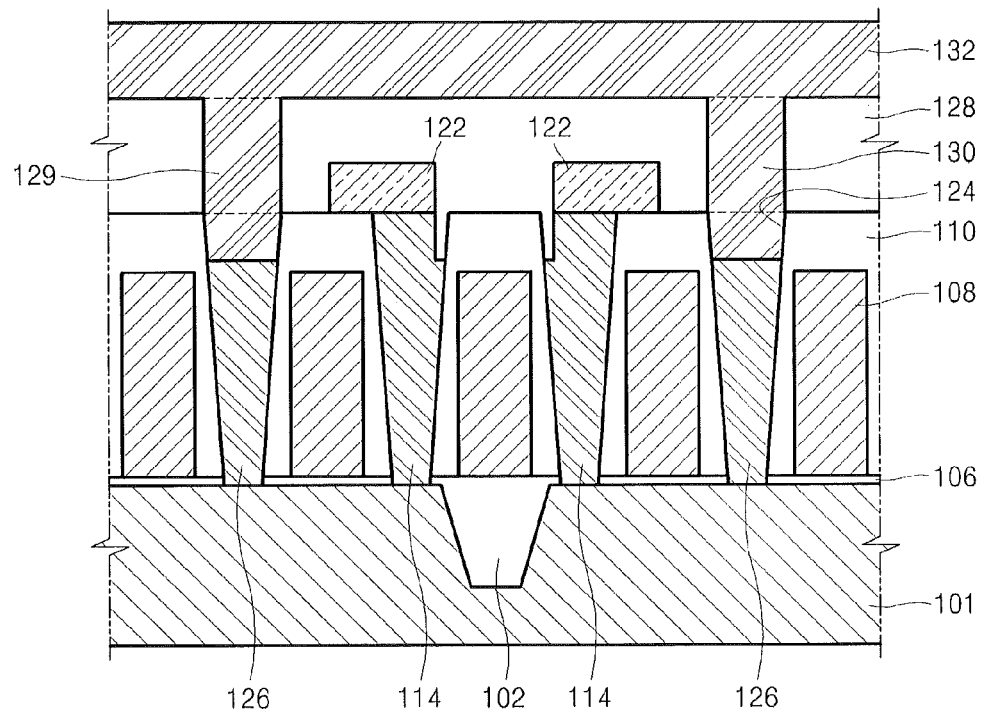

FIG. 9 is a plan view of the semiconductor device, and FIG. 10 is a cross-sectional view of the semiconductor device taken along a line X-X of FIG. 9 in some embodiments according to the present invention. Referring to FIG. 9, a planar (sometimes referred to herein as "lateral") distance between the landing pads 122 and the recessed contact plugs 126 is represented as "a." Accordingly, the recesses 124 are formed to increase the total cross-sectional distance between the landing pads 122 and the recessed contact plugs 126.

Referring to FIGS. 9 and 10, a second interlayer dielectric layer 128 is formed on the entire surface of the semiconductor substrate 101, on which the first contact plugs 114, the landing pads 122, and the recessed contact plugs 126 are formed. The second interlayer dielectric layer 128 may be formed of a silicon oxide. The landing pads 122 and the recessed contact plugs 126 are insulated from each other by the second interlayer dielectric layer 128. Contact holes 129 exposing the upper surfaces of the recessed contact plugs 126 are formed by penetrating the second interlayer dielectric layer 128.

In addition, third contact plugs 130 that are connected to the recessed contact plugs 126 are formed. The third contact plugs 130 are bit line contact plugs that are subsequently connected to bit lines. Next, bit lines 132 contacting the third contact plugs 130 are formed. The bit lines 132 are formed in a direction perpendicular to the direction in which the gate lines 108 are formed.

Figure 11:
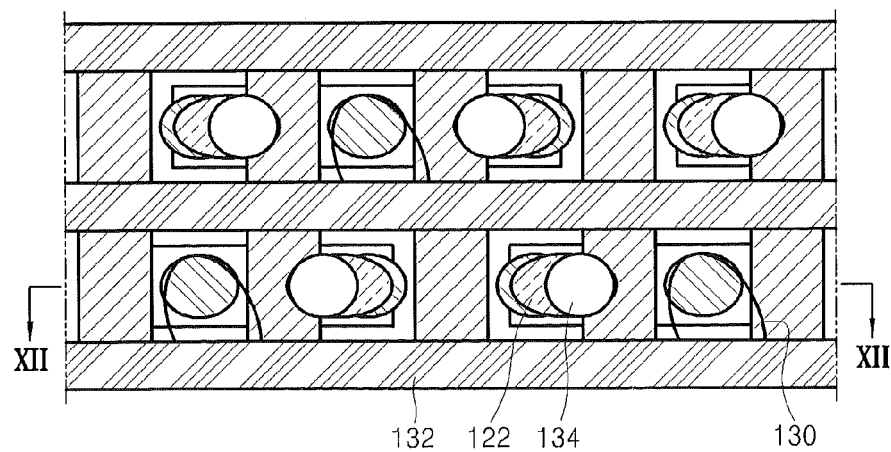
Figure 12:
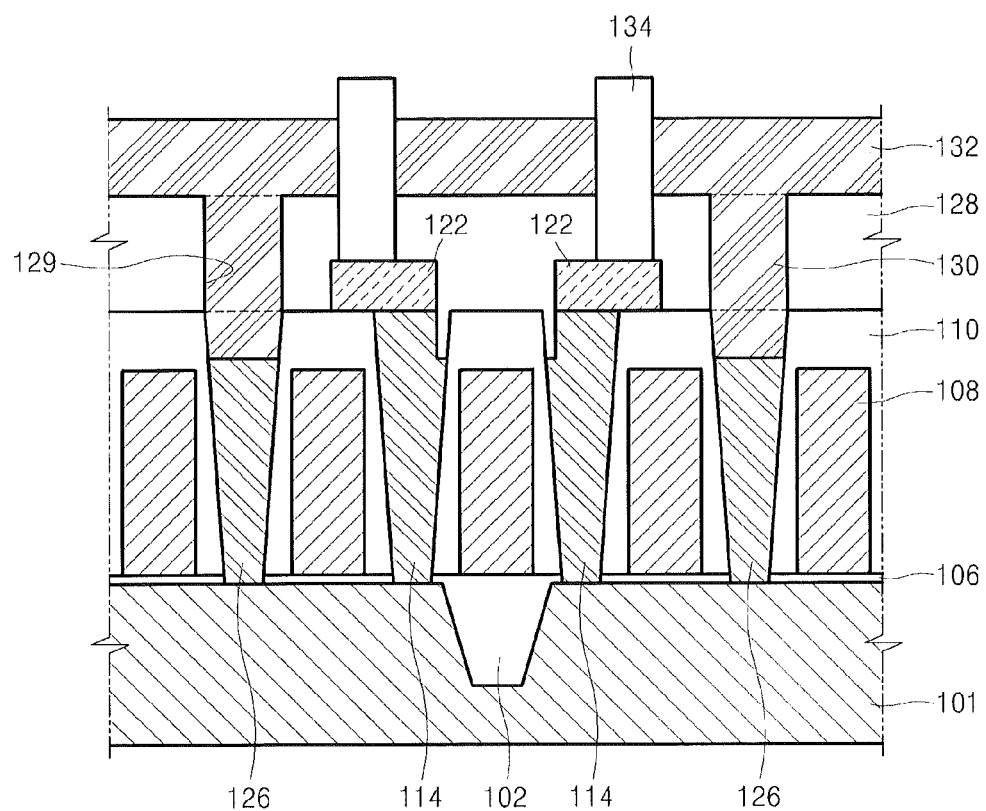

FIG. 11 is a plan view of the semiconductor device, and FIG. 12 is a cross-sectional view of the semiconductor device taken along a line XII-XII of FIG. 11 in some embodiments according to the present invention. Referring to FIGS. 11 and 12, fourth contact plugs 134 that are connected to the landing pads 122 by penetrating the second interlayer dielectric layer 128 are formed. The fourth contact plugs 134 are storage node contact plugs that are subsequently connected to storage nodes (not shown).

FIGS. 13 through 19 are schematic cross-sectional and plan views illustrating methods of fabricating a semiconductor device, in some embodiments according to the present invention. The semiconductor device of FIGS. 13 through 19 is a DRAM semiconductor device, as an example. FIGS. 13 through 19 illustrate an exemplary method of fabricating the semiconductor device, and the present invention is not limited thereto.

In some embodiments according to the present invention, the fabrication steps of the method of fabricating the semiconductor device are the same as those illustrated by FIGS. 1-3 except for forming the recessed contact plugs 126. Therefore, after performing the fabrication steps illustrated by FIGS. 1-3, the following steps can be performed.

Figure 13:
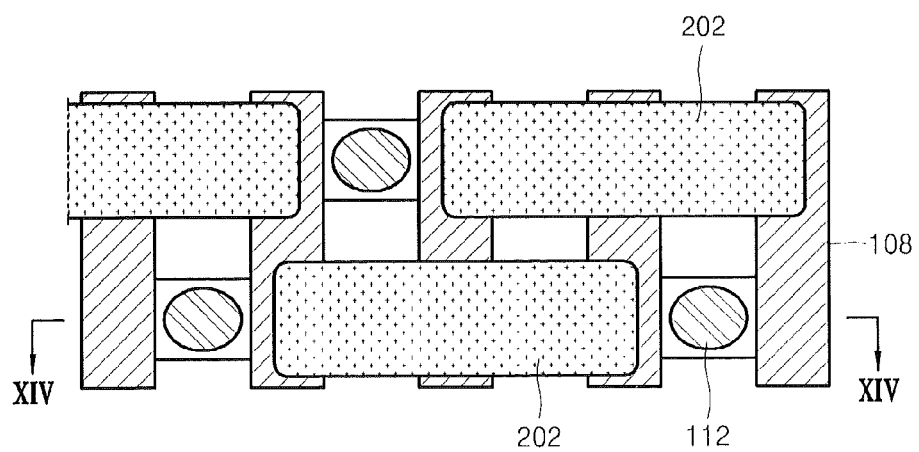
FIGS. 13 through 19 are schematic cross-sectional and plan views illustrating methods of fabricating a semiconductor device in some embodiments according to the present invention.
Figure 14:
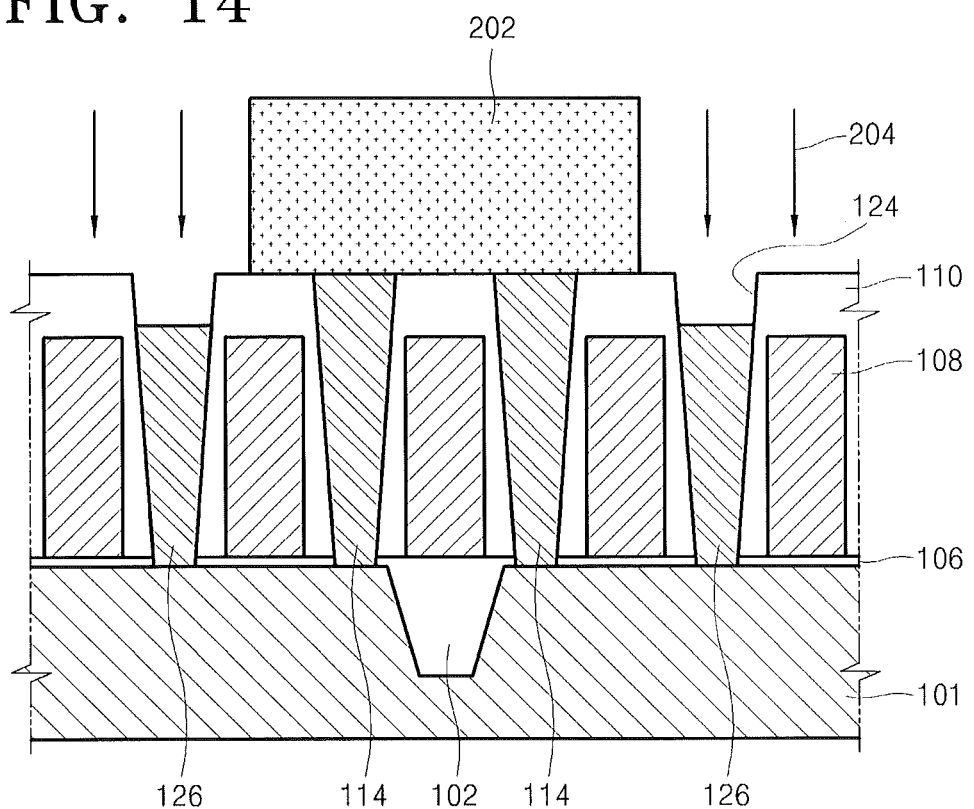

FIG. 13 is a plan view of the semiconductor device of the present embodiment, and FIG. 14 is a cross-sectional view of the semiconductor device taken along a line XIX-XIX of FIG. 13 in some embodiments according to the present invention. Referring to FIGS. 13 and 14, a mask layer 202 for forming recessed contact plugs and exposing the second contact plugs 112 is formed on the first contact plugs 114 and the first interlayer dielectric layer 110. As denoted by reference numeral 204, the second contact plugs 112 are etched using the mask layer 202 as an etching mask to form the recessed contact plugs 126 having the recesses 124 thereon. In addition, the mask layer 202 is removed.

Figure 15:
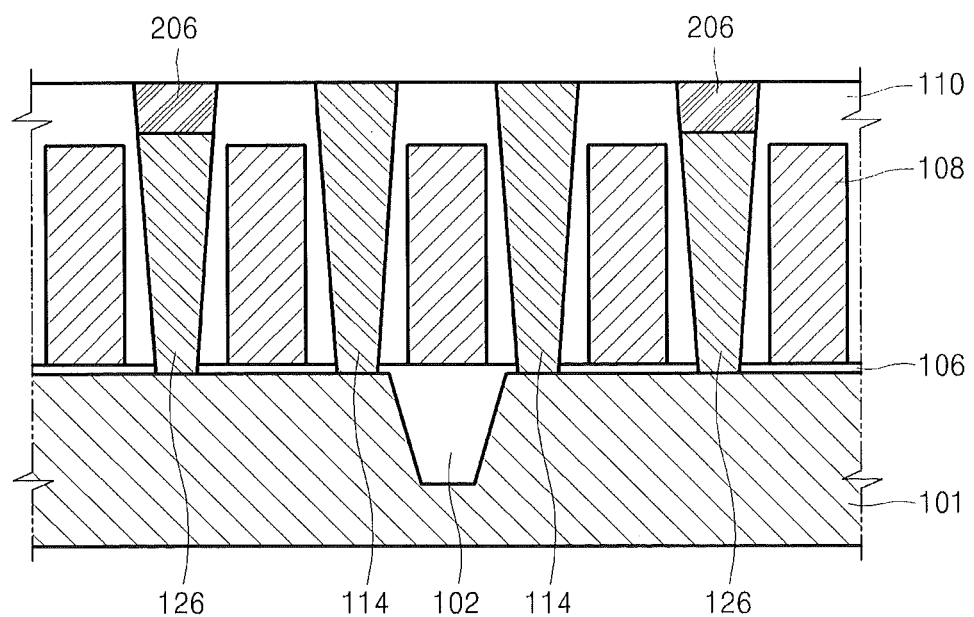
Figure 16:
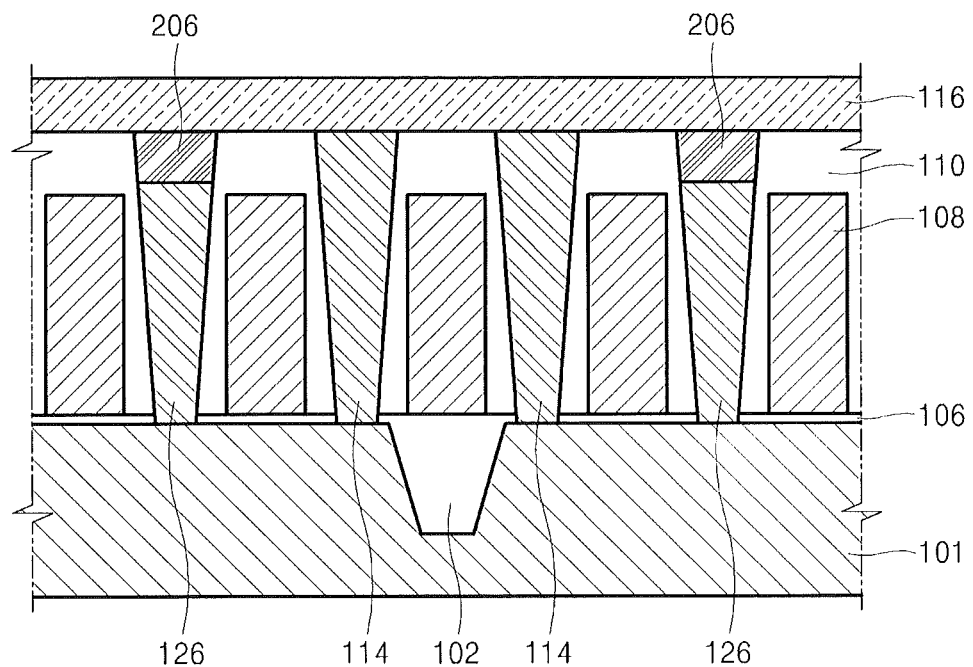

Referring to FIGS. 15 and 16, buried insulating layers 206 that fill in the recesses 124 are formed. The buried insulating layers 206 are formed by forming an insulating layer on the entire surface of the semiconductor substrate 101 so as to fill the recesses 124, and then, planarizing the formed insulating layer. In addition, as illustrated in FIG. 16, the conductive layer 116 for forming the landing pads is formed on the first contact plugs 114, the buried insulating layer 206, and the first interlayer dielectric layer 110.

Figure 17:
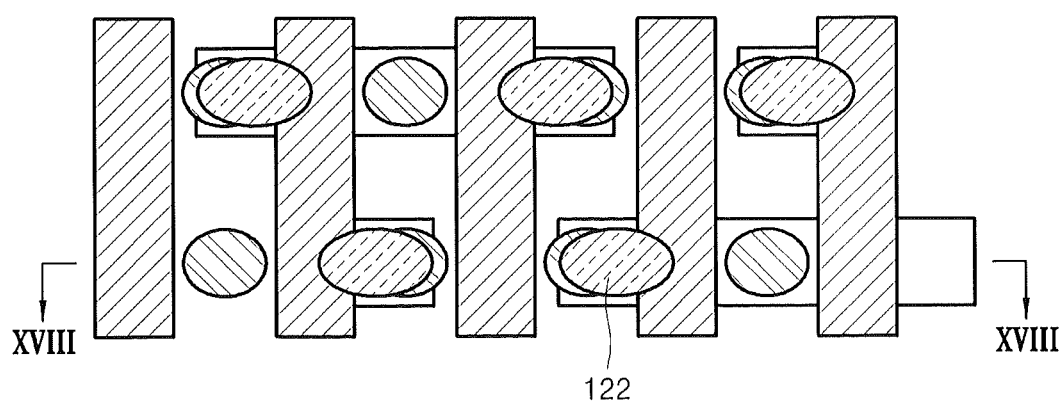
Figure 18:
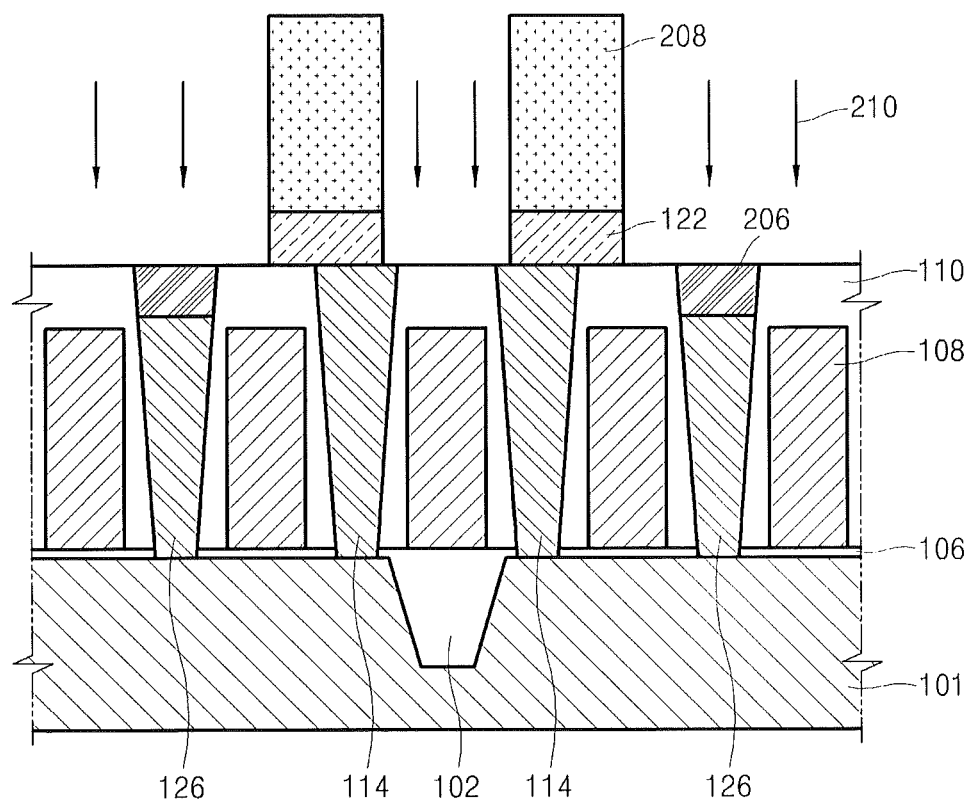

FIG. 17 is a plan view of the semiconductor device, and FIG. 18 is a cross-sectional view of the semiconductor device taken along a line XVII-XVII of FIG. 17 in some embodiments according to the present invention. Referring to FIGS. 17 and 18, a mask layer 208 for forming the landing pads is formed on the conductive layer 116 for the landing pads. The mask layer 208 is absent from portions of the substrate 110 so that the upper portions (or surfaces) of the buried insulation layers 206 are exposed.

In addition, the conductive layer 116 is etched using the mask layer 208 as an etching mask as denoted by arrows 210 so as to form the landing pads 122 that overlap portions of the first contact plugs 114. Then, the mask layer 208 for forming the landing pads is removed. In some embodiments according to the present invention, the buried insulation layers 206 are removed simultaneously with the conductive layer 116 (exposed outside the mask 208) or are removed simultaneously with the mask 208, or are removed separately before or after removal of the mask 208.

Figure 19:
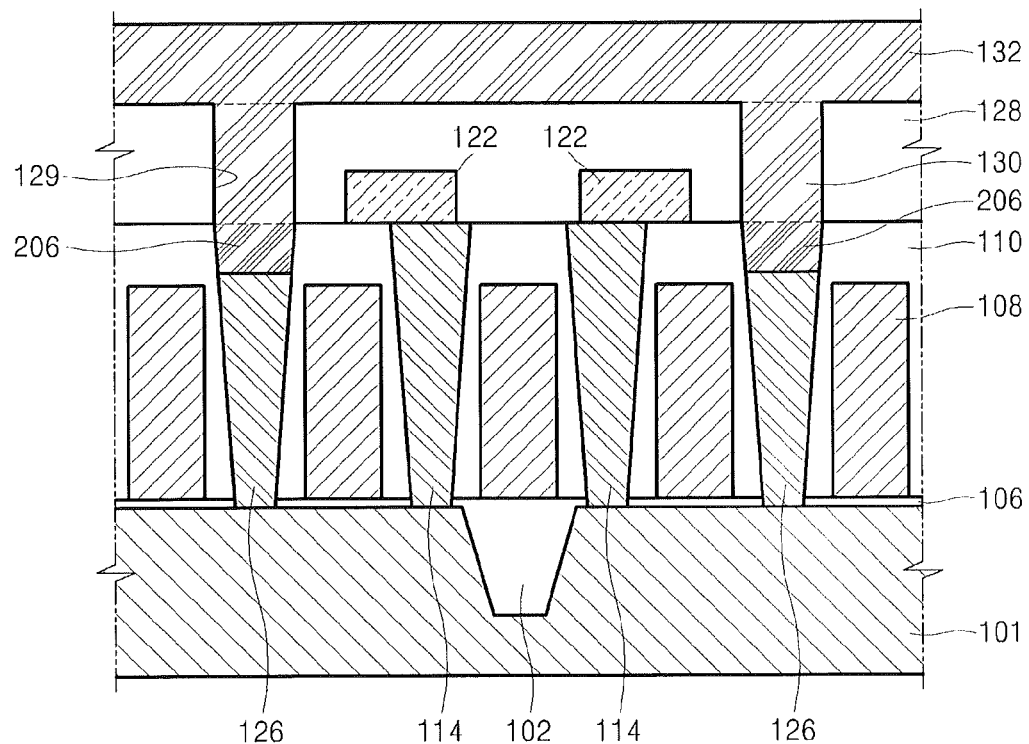

Referring to FIG. 19, the second interlayer dielectric layer 128 is formed on the entire surface of the semiconductor substrate 101, on which the first contact plugs 114, the landing pads 122, and the buried insulating layers 206 are formed. In addition, the contact holes 129 are formed by penetrating the second interlayer dielectric layer 128 to expose the upper surfaces of the recessed contact plugs 126. In some embodiments according to the invention, the buried insulation layers 206 are removed with the second interlayer dielectric layer 128 to expose the upper surfaces of the recessed contact plugs 126. Next, the third contact plugs 130 that contact the recessed contact plugs 126 are formed. The third contact plugs 130 are bit line contact plugs that are subsequently connected to bit lines. In addition, the bit lines 132 contacting the third contact plugs 130 are formed.

After that, the fourth contact plugs 134 that are connected to the landing pads 122 by penetrating the second interlayer dielectric layer 128 are formed as illustrated in FIGS. 11 and 12. The fourth contact plugs 134 are storage node contact plugs that are subsequently connected to storage nodes (not shown).

The semiconductor device according to the present invention includes landing pads formed on first contact plugs in order to increase the contact area between the first contact plugs and storage node contact plugs. In addition, according to the present invention, second contact plugs connected to bit lines, on which landing pads are not formed, are recessed to form recessed contact plugs in order to reduce the likelihood of electrical shorts.

Accordingly, the cross-sectional total, lateral and vertical, distance between the landing pads and the recessed contact plugs can be increased due to the recessed portions, and thus, electrical shorts between the landing pads and the recessed contact plugs can be reduced despite when the semiconductor device is highly integrated.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A Dynamic Random Access Memory (DRAM) device comprising:
    a semiconductor substrate including an active region including a source region therein;
    a gate line crossing the active region;
    a first contact plug on the active region adjacent to the gate line and connected to the source region;
    a conductive layer on the first contact plug exposing a portion of the first contact plug;
    a storage node contact plug on the conductive layer; and
    a capacitor storage node electrode on the storage node contact plug.

2. The device of claim 1, wherein the first contact plug comprises an upper portion of the first contact plug coplanar with an upper surface of an interlayer dielectric layer in which the first contact plug extends.

3. The device of claim 1, wherein the exposed portion of the first contact plug is positioned below an upper surface of an interlayer dielectric layer in which the first contact plug extends.

4. The device of claim 1 wherein the conductive layer overlaps the gate line.

5. The device of claim 2 wherein the upper portion of the first contact plug is covered by the conductive layer.

6. The device of claim 1 wherein the conductive layer comprises a metal containing layer.

7. The device of claim 1 further comprising:
    a second contact plug on the active region on an opposing side of the gate line relative to the first contact plug, wherein a height of the first contact plug is greater than that of the second contact plug.

8. A Dynamic Random Access Memory (DRAM) device comprising:
    a semiconductor substrate including an active region;
    a gate line crossing the active region;
    a contact plug connected to the active region on a first side of the gate line;
    a recessed contact plug, connected to the active region on a second side of the gate line opposite the first side, the recessed contact plug having an upper surface that is recessed below an upper portion of the contact plug;
    a landing pad on the upper portion of the contact plug;
    a capacitor storage node electrode connected to the landing pad; and
    a bit line connected to the upper surface of the recessed contact plug.

9. The device of claim 8, wherein the upper portion of the contact plug comprises an upper surface of the contact plug that is coplanar with an upper surface of an interlayer dielectric layer in which the contact plug extends.

10. The device of claim 8 wherein a portion of the contact plug is formed below an upper surface of an interlayer dielectric layer in which the contact plug extends.

11. The device of claim 8 wherein the landing pad overlaps the gate line.

12. The device of claim 8, wherein the landing pad exposes a portion of the contact plug.

13. The device of claim 12 wherein the exposed portion of the contact plug comprises a first upper portion of the contact plug, the device further comprising:
    a second upper portion of the contact plug coplanar with an upper surface of an interlayer dielectric layer in which the contact plug extends, wherein the second upper portion of the contact plug is covered by the landing pad.

14. A Dynamic Random Access Memory (DRAM) device comprising:

a semiconductor substrate including an isolation region separating first and second active regions in the semiconductor substrate;

first and second gate lines on the first and second active regions, respectively;

a first contact plug connected to the first active region between the first gate line and the isolation region;

a second contact plug connected to the second active region between the second gate line and the isolation region;

a first landing pad asymmetrically positioned on the first contact plug exposing an upper portion of the first contact plug nearest the isolation region; and a second landing pad asymmetrically positioned on the second contact plug exposing an upper portion of the second contact plug nearest the isolation region.

15. The device according to claim 14 further comprising:

a first recessed contact plug on the first active region on an opposing side of the first gate line relative to the first contact plug, the first recessed contact plug including an upper surface that is recessed below an upper surface of the first contact plug; and a second recessed contact plug on the second active region on an opposing side of the second gate line relative to the second contact plug, the second recessed contact plug including an upper surface that is recessed below an upper surface of the second contact plug.

16. The device according to claim 14 further comprising:

first and second storage node contact plugs on the first and second landing pads, respectively; and first and second capacitor storage node electrodes connected to the first and second storage node contact plugs, respectively.

17. A Dynamic Random Access Memory (DRAM) device comprising:

a gate line crossing an active region in a substrate;

a first contact plug on the active region adjacent to the gate line connected to the active region;

a landing pad on the first contact plug covering a first upper portion of the first contact plug closest to the gate line and exposing a second upper portion of the first contact plug farthest from the gate line; and a second contact plug on the active region on a first side of the gate line that is opposite the first contact plug.

18. A Dynamic Random Access Memory (DRAM) device comprising:

first and second gate lines on first and second active regions, respectively, separated by an isolation region therebetween;

a first contact plug connected to the first active region between the first gate line and the isolation region;

a second contact plug connected to the second active region between the second gate line and the isolation region; and first and second landing pads on the first and second contact plugs, respectively, symmetrically shifted relative to one another in opposing directions to expose upper portions of the first and second contact plugs that are nearest to one another and to cover upper portions of the first and second contact plugs that are farthest from one another.

* * * * *